United States Patent
Kang (10) Patent No.: US 10,546,627 B2
(45) Date of Patent: Jan. 28, 2020

(54) SEMICONDUCTOR DEVICE AND METHOD OF DRIVING THE SAME

(71) Applicant: SK hynix Inc., Icheon-si, Gyeonggi-do (KR)

(72) Inventor: Dong-Ho Kang, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 60 days.

(21) Appl. No.: 15/873,304

(22) Filed: Jan. 17, 2018

(65) Prior Publication Data

US 2018/0350428 A1 Dec. 6, 2018

(30) Foreign Application Priority Data

May 30, 2017 (KR) .......................... 10-2017-0066779

(51) Int. Cl.
| | |
|---|---|
| *G11C 11/406* | (2006.01) |
| *G11C 11/408* | (2006.01) |
| *G11C 11/4072* | (2006.01) |
| *G11C 8/04* | (2006.01) |

(52) U.S. Cl.
CPC .......... *G11C 11/40611* (2013.01); *G11C 8/04* (2013.01); *G11C 11/408* (2013.01); *G11C 11/4072* (2013.01); *G11C 11/40615* (2013.01); *G11C 11/40622* (2013.01)

(58) Field of Classification Search
CPC ............................ G11C 8/04; G11C 11/40611
USPC ...................................................... 365/222
See application file for complete search history.

(56) References Cited

U.S. PATENT DOCUMENTS

| | | | | |
|---|---|---|---|---|
| 6,167,484 | A * | 12/2000 | Boyer ...................... | G11C 7/24 365/222 |
| 9,478,312 | B1* | 10/2016 | Kelso ....................... | G11C 8/04 |
| 2002/0116572 | A1* | 8/2002 | Duranton .............. | G11C 11/406 711/106 |
| 2014/0359223 | A1* | 12/2014 | Yu ....................... | G06F 11/1064 711/128 |

FOREIGN PATENT DOCUMENTS

| | | |
|---|---|---|
| KR | 1020120098055 A | 9/2012 |
| KR | 1020150072051 A | 6/2015 |

\* cited by examiner

*Primary Examiner* — Huan Hoang
*Assistant Examiner* — Muna A Techane
(74) *Attorney, Agent, or Firm* — William Park & Associates Ltd.

(57) ABSTRACT

A semiconductor device may include: a low-order bit storage block configured for storing N low-order bit signals contained in N access information signals based on an access address signal, the N access information signals indicating the numbers of accesses to N access target blocks, and generating an indication signal indicating whether a low-order bit signal corresponding to the current input access address signal among the N low-order bit signals has reached a predetermined value; a high-order bit storage block configured for storing M high-order bit signals contained in M access information signals among the N access information signals based on an allocation control signal; and a high-order bit control block configured for generating the allocation control signal corresponding to positions in which the M high-order bit signals are to be stored, based on the access address signal and the indication signal.

23 Claims, 7 Drawing Sheets

FIG. 10

SEMICONDUCTOR DEVICE AND METHOD OF DRIVING THE SAME

CROSS-REFERENCE TO RELATED APPLICATIONS

The present application claims priority of Korean Patent Application No. 10-2017-0066779, filed on May 30, 2017, which is incorporated herein by reference in its entirety.

BACKGROUND

1. Technical Field

Various embodiments generally relate to a semiconductor design technology, and more particularly, to a semiconductor device and a method of driving the same.

2. Related Art

A memory cell of a semiconductor device includes a transistor serving as a switch and a capacitor for storing a charge (data). The semiconductor device having such a structure performs a refresh operation to recharge the capacitor at a predetermined cycle in consideration of a data loss caused by leakage.

With the increase in integration density of the semiconductor device, the distance between word lines included in the semiconductor device has been reduced. The reduction in distance between the word lines increases the coupling effect between word lines adjacent to each other.

Whenever data is inputted to and or outputted from a memory cell, the corresponding word line toggles between an active state and an inactive state. At this time, the coupling effect between adjacent word lines may be increased to damage the data of the memory cells coupled to word lines adjacent to a word line which is frequently enabled. Such a phenomenon is referred to as row hammering. When the row hammering occurs, the data of the memory cells may be damaged before the memory cells are refreshed.

Figure 1:
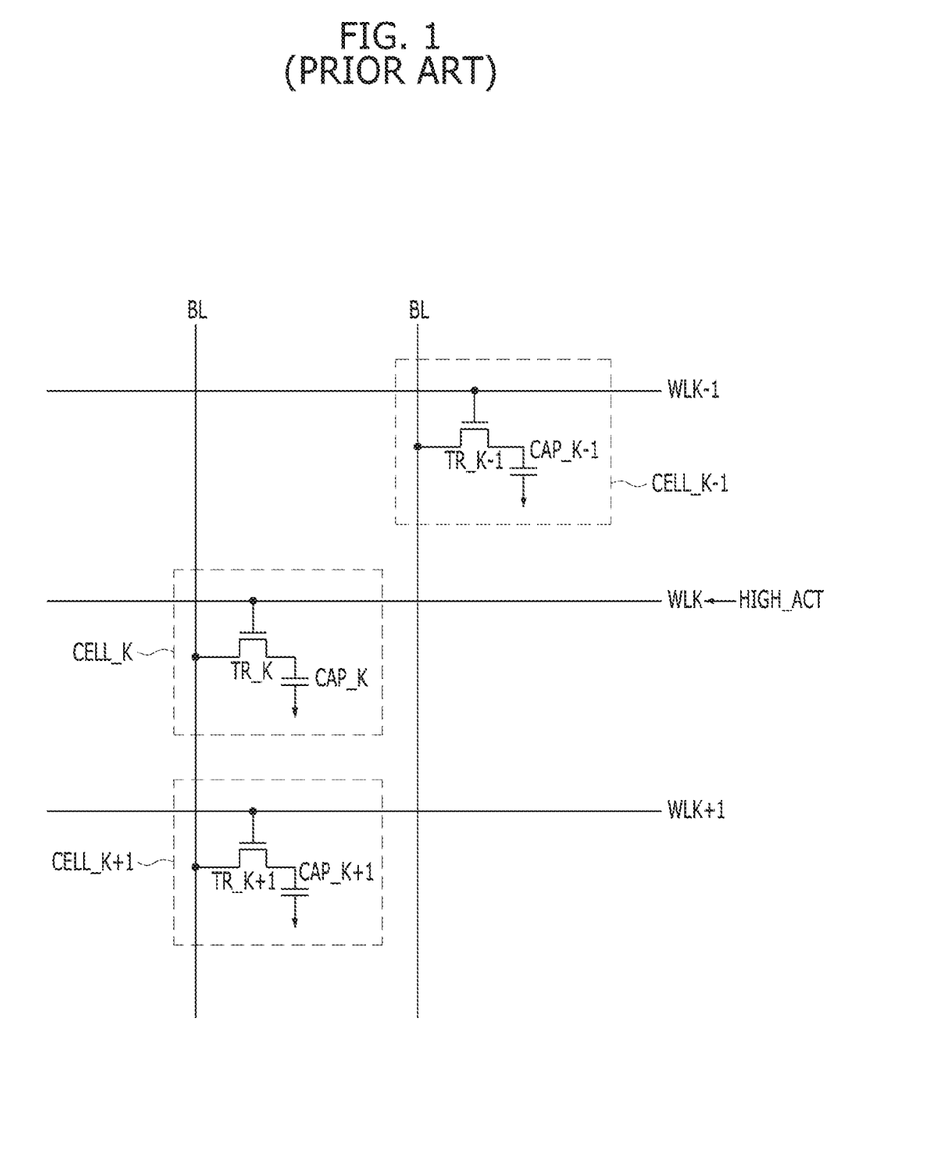
FIG. 1 illustrates a part of a memory cell array in order to describe row hammering.

FIG. 1 illustrates a part of a memory cell array included in a semiconductor device, in order to describe the row hammering.

Referring to FIG. 1, a Kth word line WLK corresponds to a word line which is frequently enabled, and (K−1)th and (K+1)th word lines WLK−1 and WLK+1 correspond to word lines adjacent to the Kth word line WLK. Furthermore, a Kth memory cell CELL_K indicates a memory cell coupled to the Kth word line WLK, a (K−1)th memory cell CELL_K−1 indicates a memory cell coupled to the (K−1)th word line WLK−1, and a (K+1)th memory cell CELL_K+1 indicates a memory cell coupled to the (K+1)th word line WLK+1. The memory cells include cell transistors TR_K, TR_K−1 and TR_K+1 and cell capacitors CAP_K, CAP_K−1 and CAP_K+1, respectively.

When the Kth word line WLK toggles between the active state and the inactive state, the voltages of the (K−1)th and (K+1)th word lines WLK−1 and WLK+1 may be raised or lowered by the coupling effect between the Kth and (K−1)th word lines WLK and WLK−1 and the coupling effect between the Kth and (K+1)th word lines WLK and WLK+1, thereby having an influence on the charges of the cell capacitors CELL_K−1 and CELL_K+1. Therefore, when the Kth word line WLK frequently toggles between the active state and the inactive state, the data of the (K−1)th and (K+1)th memory cells CELL_K−1 and CELL_K+1 may be degraded.

Furthermore, electromagnetic waves which are generated while the word line toggles between the active state and the inactive state may introduce electrons into the cell capacitors of the memory cells coupled to the adjacent word lines or leak electrons from the cell capacitors, thereby damaging the data of the memory cells.

In order to remove the row hammering which may occur when an arbitrary word line (for example, WLK) is enabled a predefined number of times or more, and degrade data of memory cells coupled to adjacent word lines (for example, WLK+1 and WLK−1), an additional refresh operation may be performed on the adjacent word lines affected by the row hammering, besides a general refresh operation (normal refresh operation).

SUMMARY

In an embodiment, a semiconductor device may include a low-order bit storage block configured for storing N low-order bit signals contained in N access information signals based on an address signal, the N access information signals indicating the numbers of accesses to N access target blocks, and generating an indication signal indicating whether a low-order bit signal corresponding to the current input access address signal among the N low-order bit signals has reached a predetermined value, where N is a natural number equal to or greater than 2. The semiconductor device may include a high-order bit storage block configured for storing M high-order bit signals contained in M access information signals among the N access information signals based on an allocation control signal, where M may be a natural number less than N. The semiconductor device may include a high-order bit control block configured for generating the allocation control signal corresponding to positions in which the M high-order bit signals are to be stored, based on the address signal and the indication signal.

In an embodiment, a semiconductor device may include a memory cell array. The semiconductor device may include an access detection circuit configured for storing N low-order bit signals contained in N access information signals indicating the numbers of accesses to N word line groups and M high-order bit signals contained in M access information signals among the N access information signals, based on a word line group address signal, and generating an access information signal corresponding to the current input word line group address signal among the N access information signals, where M may be a natural number smaller than N. The semiconductor device may include a refresh control circuit configured for generating a target group address signal required for a refresh operation of the memory cell array, based on the word line group address signal, the access information signal and a refresh control signal.

In an embodiment, a method of driving a semiconductor device may be provided. The method may include receiving a word line group address signal. The method may include fixedly storing N low-order bit signals contained in N access information signals into a low-order bit storage block based on the word line group address signal, the N access information signals indicating the numbers of accesses to N word line groups, where N may be a natural number equal to or greater than 2. The method may include flexibly storing M high-order bit signals contained in M access information signals among the N access information signals into a high-order bit storage block based on the word line group address signal, where M may be a natural number smaller than N. The method may include driving a selected word line group among the N word line groups based on the word line group address signal, the N access information signals and a refresh control signal.

DETAILED DESCRIPTION

Various embodiments will be described below in with reference to the accompanying drawings. The embodiments may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments.

Various embodiments may be directed to a semiconductor device capable of detecting row hammering, and a method of driving the same.

Figure 2:
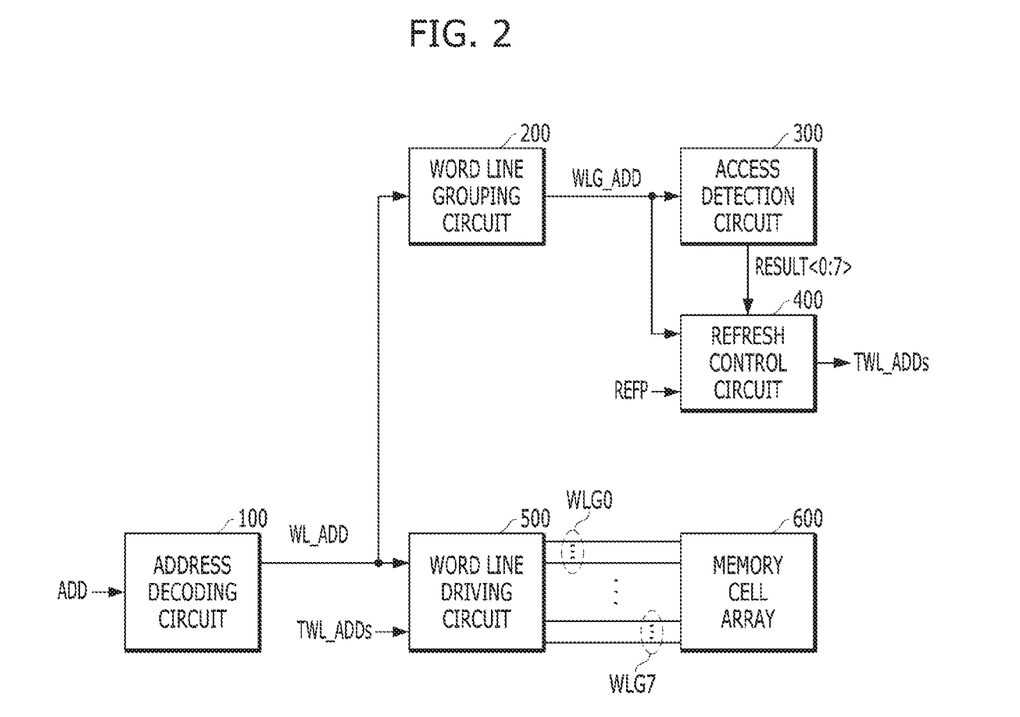
FIG. 2 is a block diagram of a semiconductor device in accordance with an embodiment.

FIG. 2 is a block diagram illustrating a memory device in accordance with an embodiment.

Referring to FIG. 2, the semiconductor device may include an address decoding circuit 100, a word line grouping circuit 200, an access detection circuit 300, a refresh control circuit 400, a word line driving circuit 500 and a memory cell array 600.

The memory cell array 600 may include a plurality of memory cells, a plurality of bit lines and a plurality of word lines. The plurality of word lines may be divided into N word line groups (i.e., N access target blocks) where N is a natural number equal to or more than 2. For example, the plurality of word lines may be divided into first to eighth word line groups WLG0 to WLG7 each including an equal number of word lines.

The address decoding circuit 100 may generate a word line address signal WL_ADD corresponding to any one word line among the plurality of word lines, based on an address signal ADD. The address signal ADD may indicate the logical address of the word line. The word line address signal WL_ADD corresponding to an actual access address signal of the word line may indicate the physical address of the word line. In an embodiment, for example, the address decoding circuit 100 may be configured for generating an access address signal corresponding to a selected word line among a plurality of word lines included in the N word line groups (i.e., WLG0-WLG7), based on an address signal ADD.

The word line grouping circuit 200 may generate a word line group address signal WLG_ADD corresponding to any one word line group among the first to eighth word line groups WLG0 to WLG7, based on the word line address signal WL_ADD. For example, the word line grouping circuit 200 may select a word line group to which a word line corresponding to the word line address signal WL_ADD belongs, among the first to eighth word line groups WLG0 to WLG7, and generate the word line group address signal WLG_ADD corresponding to the selected word line group.

The access detection circuit 300 may generate an access information signal RESULT<0:7> corresponding to the current input word line group address signal WLG_ADD among first to eight access information signals indicating the numbers of accesses to the first to eighth word line groups WLG0 to WLG7, based on the word line group address signal WLG_ADD. For example, the access information signal RESULT<0:7> may include an 8-bit signal corresponding to a result obtained by counting the number of accesses. The access detection circuit 300 may store first to eight low-order bit signals contained in the first to eighth access information signals and M high-order bit signals contained in M access information signals among the first to eighth access information signals, where M is a natural number smaller than N. For example, the access detection circuit 300 may store four high-order bit signals contained in four access information signals among the first to eighth access information signals.

The refresh control circuit 400 may generate a target group address signal TWL_ADDs required for a refresh operation of the memory cell array 600, based on the word line group address signal WLG_ADD, the access information signal RESULT<0:7> and a refresh control signal REFP. For example, the refresh operation may include a target refresh operation. The target refresh operation refers to an operation of additionally refreshing word lines adjacent to an arbitrary word line besides a normal refresh operation, in order to remove row hammering which may occur when the arbitrary word line is accessed or driven a predefined number of times or more, and degrade data of memory cells coupled to the adjacent word lines.

The word line driving circuit 500 may drive one or more word lines among the plurality of word lines, based on the word line address signal WL_ADD and the target group address signal TWL_ADDs. For example, the word line driving circuit 500 may sequentially drive the plurality of word lines based on the word line address signal WL_ADD during the normal refresh operation, and sequentially drive word lines included in any one word line group among the first to eighth word line groups WLG0 to WLG7 based on the target group address signal TWL_ADDs during the target refresh operation.

Figure 3:
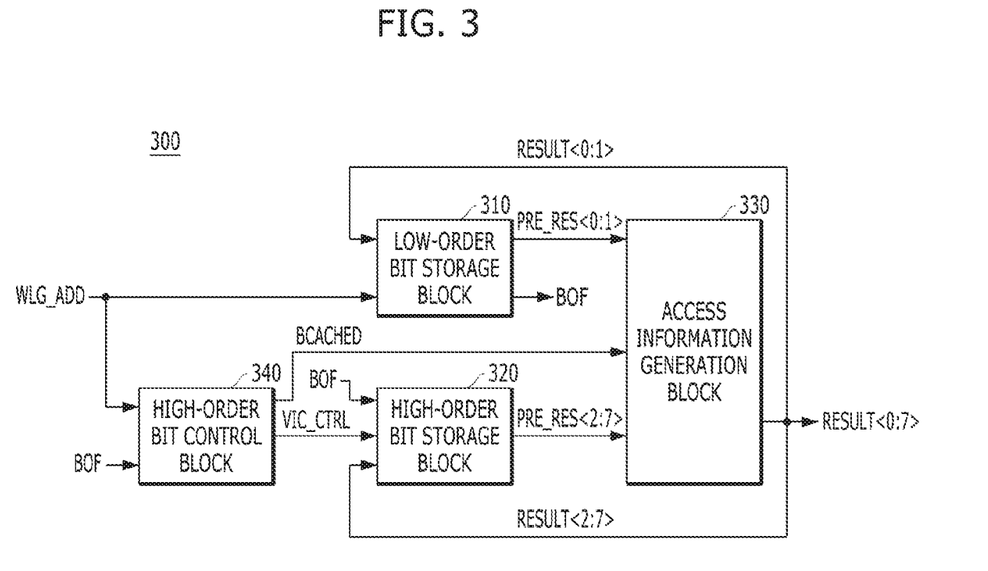
FIG. 3 is an internal configuration diagram illustrating an access detection circuit of FIG. 2.

FIG. 3 is a block diagram of the access detection circuit 300 illustrated in FIG. 2.

Referring to FIG. 3, the access detection circuit 300 may include a low-order bit storage block 310, a high-order bit storage block 320, an access information generation block 330 and a high-order bit control block 340.

The low-order bit storage block 310 may store the first to eighth low-order bit signals based on the word line group address signal WLG_ADD. For example, the low-order bit storage block 310 may store a low-order bit signal RESULT<0:1> corresponding to the current input word line group address signal WLG_ADD, among the first to eighth low-order bit signals. The low-order bit signal RESULT<0:1> may indicate low-order two bits of eight bits contained in the access information signal RESULT<0:7>. For example, the low-order bit storage block 310 may include an SRAM (Static Random Access Memory), and have a capacity corresponding to the first to eighth low-order bit signals. The capacity may correspond to a physical size. For example, with reference to the storage block 310 having a capacity corresponding to the first to eighth low-order bit signals, a capacity corresponding to greater than first to eighth low-order bit signals may increase the physical size or area needed for the storage block 310 to store a greater number of low-order bit signals, and a capacity corresponding to less than first to eight low-order bit signals may decrease the physical size or area needed for the storage block 310 to store a lesser number of low-order bit signals. The low-order bit storage block 310 may generate an indication signal BOF indicating whether a low-order bit signal has reached the maximum value, the low-order bit signal corresponding to the current input word line group address signal WLG_ADD among the first to eighth low-order bit signals. The maximum value may indicate the maximum value of the 2-bit count value, and correspond to '11'. In an embodiment, the maximum value may indicate a predetermined value less than or equal to a maximum value of a certain number of bits for a bit count value, and may correspond to this predetermined value. In an embodiment, for example, a predetermined value of a 2-bit count value may correspond to '01', '00', '10', or '11'.

The high-order bit storage block 320 may store four high-order bit signals based on an allocation control signal VIC_CTRL. For example, the high-order bit storage block 320 may store the high-order bit signal RESULT<2:7> corresponding to the current input word line group address signal WLG_ADD, among the four high-order bit signals. The high-order bit signal RESULT<2:7> may indicate high-order six bits of the eight bits contained in the access information signal RESULT<0:7>. For example, the high-order bit storage block 320 may include an SRAM, and have a capacity corresponding to the four high-order bit signals. The capacity may correspond to a physical size. For example, with reference to the storage block 320 having a capacity corresponding to the four high-order bit signals, a capacity corresponding to greater than four high-order bit signals may increase the physical size or area needed for the storage block 320 to store a greater number of high-order bit signals and a capacity corresponding to less than four high-order bit signals may decrease the physical size or area needed for the storage block 320 to store a lesser number of high-order bit signals. The high-order bit storage block 320 may allocate positions in which the four high-order signals are to be stored, through a predefined method. For example, the high-order bit storage block 320 may allocate the positions in a round robin manner.

The access information generation block 330 may generate the access information signal RESULT<0:7> based on a reallocation confirmation signal BCACHED. For example, the access information generation block 330 may generate the access information signal RESULT<0:7> based on a first pre-high-order bit signal PRE_RES<2:7> and a pre-low-order bit signal PRE_RES<0:1>. The first pre-high-order bit signal PRE_RES<2:7> may include any one high-order bit signal corresponding to the current input word line group address signal WLG_ADD, among the four high-order bit signals stored in the high-order bit storage block 320. The pre-low-order bit signal PRE_RES<0:1> may include any one low-order bit signal corresponding to the current input word line group address signal WLG_ADD, among the first to eighth low-order bit signals stored in the low-order bit storage block 310.

The high-order bit control block 340 may generate the allocation control signal VIC_CTRL and the reallocation confirmation signal BCACHED, based on the word line group address signal WLG_ADD and the indication signal BOF. The allocation control signal VIC_CTRL may contain information indicating the positions in which the four high-order bit signals are to be stored. The reallocation confirmation signal BCACHED may contain information indicating whether to reallocate the position in which any one of the four high-order bit signals is to be stored.

Figure 4:
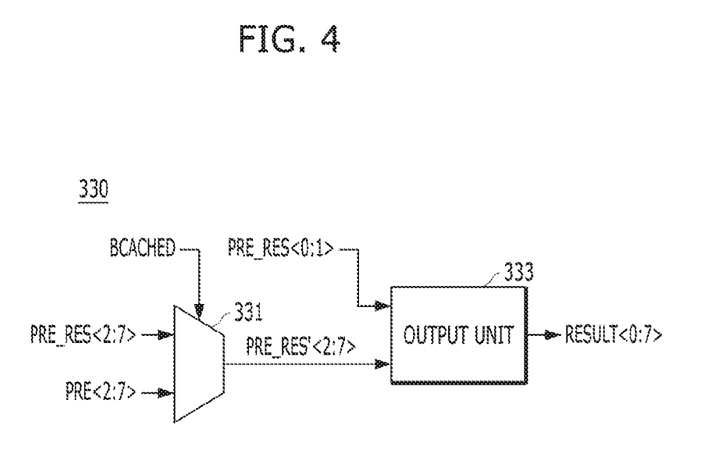
FIG. 4 is an internal configuration diagram illustrating an access information generation block of FIG. 3.

FIG. 4 is a block diagram illustrating the access information generation block 330 of FIG. 3.

Referring to FIG. 4, the access information generation block 330 may include a selection unit 331 and an output unit 333.

The selection unit 331 may select any one of a preset high-order bit signal PRE<2:7> and the first pre-high-order bit signal PRE_RES<2:7> as a second pre-high-order bit signal PRE_RES'<2:7>, based on the reallocation confirmation signal BCACHED. For example, the selection unit 331 may select the first pre-high-order bit signal PRE_RES<2:7> as the second pre-high-order bit signal PRE_RES'<2:7> according to the disabled reallocation confirmation signal BCACHED. On the other hand, the selection unit 331 may select the high-order bit signal PRE<2:7> in place of the first pre-high-order bit signal PRE_RES<2:7> as the second pre-high-order bit signal PRE_RES'<2:7> according to the enabled reallocation confirmation signal BCACHED. The preset high-order bit signal PRE<2:7> may include a 6-bit signal of '000000'.

The output unit 333 may generate the access information signal RESULT<0:7> based on the second pre-high-order bit signal PRE_RES'<2:7> and the pre-low-order bit signal PRE_RES<0:1>. For example, the output unit 333 may generate the access information signal RESULT<0:7> by up-counting a pre-access information signal including the second pre-high-order bit signal PRE_RES'<2:7> and the pre-low-order bit signal PRE_RES<0:1>. That is, the output unit 333 may generate the access information signal RESULT<0:7> by adding '1' to the least significant bit (LSB) of the pre-access information signal.

Figure 5:
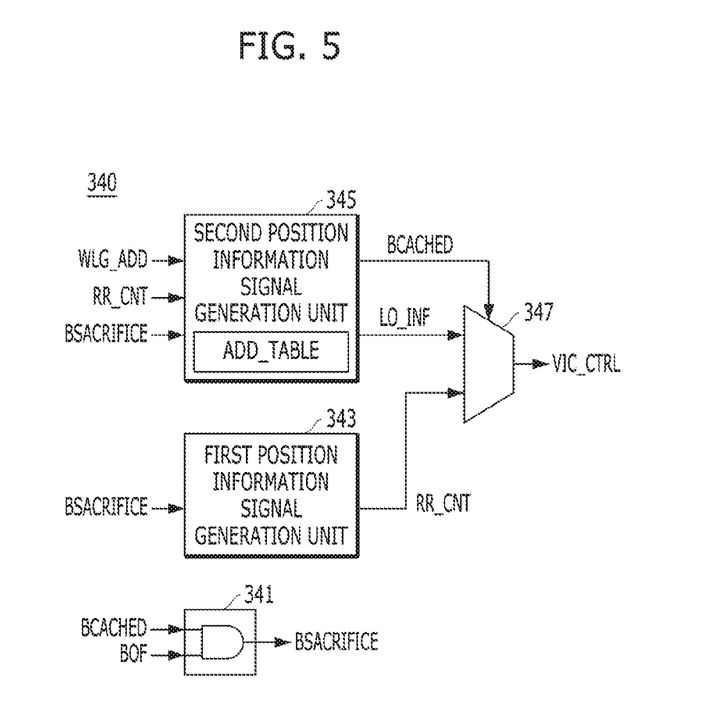
FIG. 5 is an internal configuration diagram illustrating a high-order bit control block of FIG. 3.

FIG. 5 is a block diagram illustrating the high-order bit control block 340 of FIG. 3.

Referring to FIG. 5, the high-order bit control block 340 may include a logical operation unit 341, a first position information signal generation unit 343, a second position information signal generation unit 345 and an allocation control signal output unit 347.

The logical operation unit 341 may generate an update signal BSACRIFICE by performing a logical operation on the indication signal BOF and the reallocation confirmation signal BCACHED. For example, the logical operation unit 341 may include an AND gate.

The first position information signal generation unit 343 may generate a first position information signal RR_CNT which is varied in the predefined manner, based on the update signal BSACRIFICE. For example, the first position information signal generation unit 343 may generate the 2-bit first position information signal RR_CNT which is varied in order of '00', '01', '10' and '11' whenever the update signal BSACRIFICE is enabled.

The second position information signal generation unit 345 may include an address storage table ADD_TABLE for storing four word line group address signals WLG_ADD corresponding to the four access information signals RESULT<0:7>. For example, the four word line group address signals may be stored in first to fourth positions (or addresses) of the address storage table ADD_TABLE. In the address storage table ADD_TABLE, the four word line group address signals may be randomly stored as the initial values, the four word line group address signals preset to the initial values may be stored, or the same value of '000', for example, may be stored as the initial values.

The second position information signal generation unit 345 may generate the reallocation confirmation signal BCACHED and a second position information signal LO_INF based on the first position information signal RR_CNT, the update signal BSACRIFICE and the word line group address signal WLG_ADD. For example, the second position information signal generation unit 345 may determine whether any one of the four word line group address signals coincides with the current input word line group address signal WLG_ADD, and generate the reallocation confirmation signal BCACHED and the second position information signal LO_INF according to the determination result. When any one of the four word line group address signals coincides with the current input word line group address signal WLG_ADD, the second position information signal generation unit 345 may disable the reallocation confirmation signal BCACHED, and generate the second position information signal LO_INF corresponding to the position in which any one of the four word line group address signals is stored. For example, when the current input word line group address signal WLG_ADD corresponds to the seventh word line group WLG6 and the word line group address signal corresponding to the seventh word line group WLG6 is stored in the fourth position of the address storage table, the second position information signal generation unit 345 may disable the reallocation confirmation signal BCACHED, and generate the second position information signal LO_INF corresponding to the fourth position. On the other hand, when none of the four word line group address signals coincides with the current input word line group address signal WLG_ADD, the second position information signal generation unit 345 may enable the reallocation confirmation signal BCACHED, and not generate the second position information signal LO_INF.

When none of the four word line group address signals coincides with the current input word line group address signal WLG_ADD, the second position information signal generation unit 345 may selectively store the current input word line group address signal WLG_ADD in a position corresponding to the first position information signal RR_CNT, depending on whether the update signal BSACRIFICE is enabled.

The allocation control signal output unit 347 may output any one of the first and second position information signals RR_CNT and LO_INF as the allocation control signal VIC_CTRL, based on the reallocation confirmation signal BCACHED. For example, the allocation control signal output unit 347 may output the first position information signal RR_CNT as the allocation control signal VIC_CTRL according to the enabled reallocation confirmation signal BCACHED. On the other hand, the allocation control signal output unit 347 may output the second position information signal LO_INF as the allocation control signal VIC_CTRL according to the disabled reallocation confirmation signal BCACHED.

Figure 6:
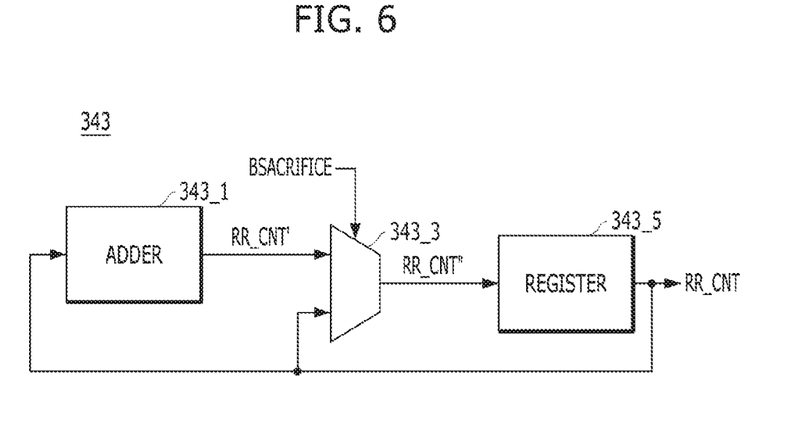
FIG. 6 is an internal configuration diagram illustrating a first position information signal generation unit of FIG. 5.

FIG. 6 is a block diagram illustrating the first position information signal generation unit 343 of FIG. 5.

Referring to FIG. 6, the first position information signal generation unit 343 may include an adder 343_1, a multiplexer 343_3 and a register 343_5.

The adder 343_1 may generate a first position information variation signal RR_CNT' by up-counting the first position information signal RR_CNT according to the predefined method. For example, the adder 343_1 may generate the first position information variation signal RR_CNT' by adding '1' to the LSB of the first position information signal RR_CNT.

The multiplexer 343_3 may select any one of the first position information signal RR_CNT and the first position information variation signal RR_CNT' as a first position information output signal RR_CNT", based on the update signal BSACRIFICE.

The register 343_5 may store the first position information output signal RR_CNT" as the first position information signal RR_CNT. The register 343_5 may store the first position information signal RR_CNT of '00' as the initial value.

Hereafter, the operation of the semiconductor device having an above-described configuration in accordance with the present embodiment will be described with reference to FIGS. 7 to 9.

Figure 7:
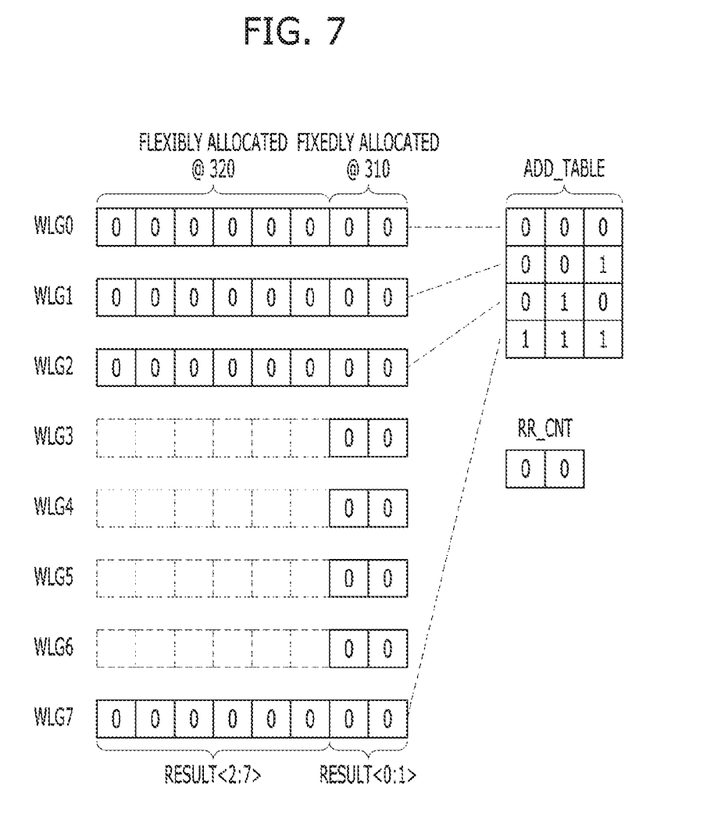
FIGS. 7 to 9 are diagrams for describing an operation of the semiconductor device illustrated in FIG. 2.

FIG. 7 illustrates the initialized state of the access detection circuit 300 included in the semiconductor device.

Referring to FIG. 7, the access detection circuit 300 may store the access information signal RESULT<0:7> corresponding to the first to eighth word line groups WLG0 to WLG7. For example, the low-order bit storage block 310 may store the low-order bit signals RESULT<0:1> in fixedly allocated positions, the low-order bit signals RESULT<0:1> being contained in the first to eighth access information signals, respectively, and the high-order bit storage block 320 may store the high-order bit signals RESULT<2:7> in flexibly allocated positions, the high-order bit signals RESULT<2:7> being contained in the four access information signals, respectively, among the first to eighth access information signals. At this time, each of the low-order bit signals RESULT<0:1> may have the initial value of '00', and each of the high-order bit signals RESULT<2:7> may have the initial value of '000000'.

The access detection circuit 300 may store four word line group address signals corresponding to the four high-order bit signals. For example, the four word line group address signals may be stored in the first to fourth positions (or addresses) of the address storage table ADD_TABLE. In the address storage table ADD_TABLE, the word line group address signal WLG_ADD corresponding to the first word line group WLG0 may be stored in the first position, the word line group address signal WLG_ADD corresponding to the second word line group WLG1 may be stored in the second position, the word line group address signal WLG_ADD corresponding to the third word line group WLG2 may be stored in the third position, and the word line group address signal WLG_ADD corresponding to the eighth word line group WLG7 may be stored in the fourth position, as the initial values. In a present embodiment, the four word line group address signals may be stored as the initial values in the address storage table ADD_TABLE. The present embodiments are not limited thereto, but the four word line group address signals may be randomly stored as the initial values or stored as the same value of '000', for example.

The access detection circuit 300 may store the first position information signal RR_CNT in the register 343_5, the first position information signal RR_CNT being used for flexibly allocating or reallocating the positions in which the four high-order bit signals are to be stored. At this time, the first position information signal RR_CNT may have the initial value of '00'.

Figure 8:
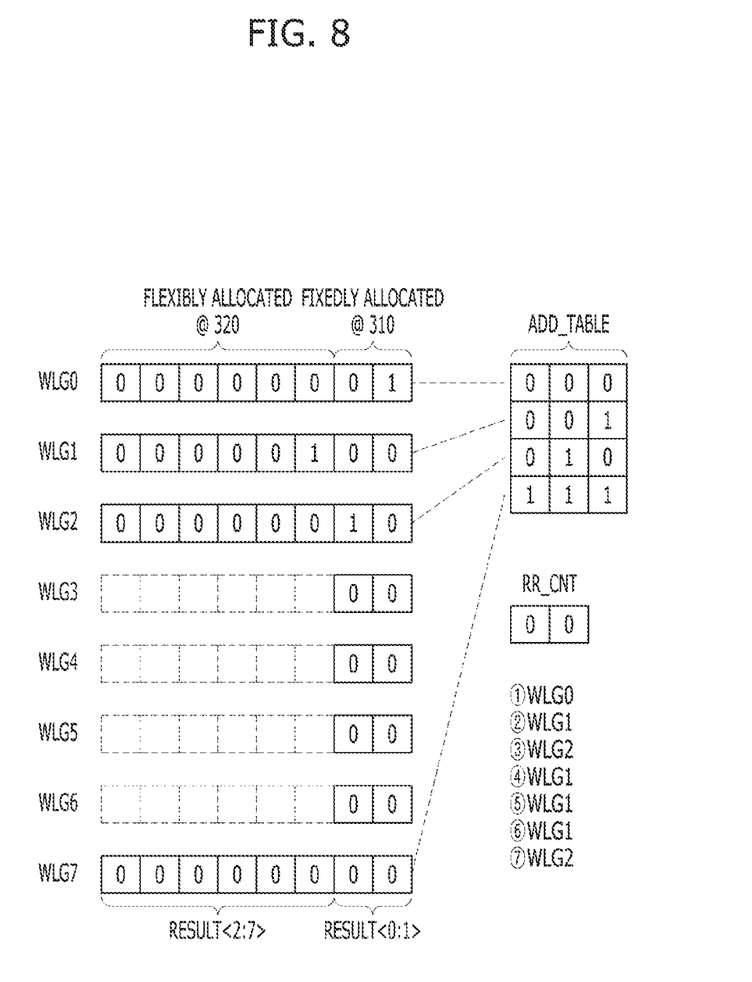

FIG. 8 is a diagram for describing the operation of the semiconductor device, based on the configuration illustrated in FIG. 7.

FIG. 8 may be based on the supposition that seven address signals ADD have been sequentially inputted, the word line address signal WL_ADD belonging to the first word line group WLG0, the word line address signal WL_ADD belonging to the second word line group WLG1, the word line address signal WL_ADD belonging to the third word line group WLG2, the word line address signal WL_ADD belonging to the second word line group WLG1, the word line address signal WL_ADD belonging to the second word line group WLG1, the word line address signal WL_ADD belonging to the second word line group WLG1, and the word line address signal WL_ADD belonging to the third word line group WLG2 have been sequentially generated as decoding results of the address decoding circuit 100.

In this case, the first word line group WLG0 has been accessed once, the second word line group WLG1 has been accessed four times, and the third word line group WLG2 has been accessed twice. Thus, the access information signal RESULT<0:7> corresponding to the first word line group WLG0 may have a value of '00000001', the access information signal RESULT<0:7> corresponding to the second word line group WLG1 may have a value of '00000100', and the access information signal RESULT<0:7> corresponding to the third word line group WLG2 may have a value of '00000010'.

Hereafter, the case in which the word line address signal WL_ADD belonging to the first word line group WLG0 is generated according to the address signal ADD inputted for the first time and the case in which the word line address signal WL_ADD belonging to the second word line group WLG1 is generated according to the address signal ADD inputted for the sixth time will be described representatively described.

First, the case in which the word line address signal WL_ADD belonging to the first word line group WLG0 is generated according to the address signal ADD inputted for the first time will be described.

The word line grouping circuit 200 may generate the word line group address signal WLG_ADD corresponding to the first word line group WLG0 based on the word line address signal WL_ADD belonging to the first word line group WLG0. The access detection circuit 300 may generate the access information signal RESULT<0:7> of '00000001' by adding '1' to the LSB of the pre-access information signal PRE_RES<0:7> corresponding to the first word line group WLG0, based on the word line group address signal WLG_ADD corresponding to the first word line group WLG0. The operation of the access detection circuit 300 will be described as follows.

The low-order bit storage block 310 may output the pre-low-order bit signal PRE_RES<0:1> corresponding to the first word line group WLG0 to the access information generation block 330 based on the word line group address signal WLG_ADD. For example, the low-order bit storage block 310 may output the pre-low-order bit signal PRE_RES<0:1> of '00' to the access information generation block 330. Furthermore, the low-order bit storage block 310 may output the indication signal BOF to the high-order bit control block 340, based on the pre-low-order bit signal PRE_RES<0:1> corresponding to the first word line group WLG0. For example, since the pre-low-order bit signal PRE_RES<0:1> has not reached '11', the low-order bit storage block 310 may output the disabled indication signal BOF to the high-order bit control block 340.

The high-order bit control block 340 may generate the reallocation confirmation signal BCACHED and the allocation control signal VIC_CTRL, based on the indication signal BOF and the word line group address signal WLG_ADD. For example, since the word line group address signal WLG_ADD corresponding to the first word line group WLG0 is present in the address storage table ADD_TABLE, the high-order bit control block 340 may disable the reallocation confirmation signal BCACHED. Then, the high-order bit control block 340 may generate the allocation control signal VIC_CTRL corresponding to the first position of the address storage table ADD_TABLE, based on the disabled reallocation confirmation signal BCACHED. This is because the word line group address signal WLG_ADD corresponding to the first word line group WLG0 is stored in the first position of the address storage table ADD_TABLE. At this time, the allocation control signal VIC_CTRL may have a value of '00' corresponding to the first position.

The high-order bit storage block 320 may output the first pre-high-order bit signal PRE_RES<2:7> corresponding to the first word line group WLG0 to the access information generation block 330 based on the allocation control signal VIC_CTRL. For example, the high-order bit storage block 320 may output the first pre-high-order bit signal PRE_RES<2:7> of '000000' to the access information generation block 330.

The access information generation block 330 may generate the access information signal RESULT<0:7> corresponding to the first pre-high-order bit signal PRE_RES<2:7> and the pre-low-order bit signal PRE_RES<0:1>, based on the reallocation confirmation signal BCACHED. For example, the selection unit 331 may select the first pre-high-order bit signal PRE_RES<2:7> as the second pre-high-order bit signal PRE_RES'<2:7> according to the disabled reallocation confirmation signal BCACHED, and the output unit 333 may generate the access information signal RESULT<0:7> by adding '1' to the LSB of the pre-access information signal containing the second pre-high-order bit signal PRE_RES'<2:7> and the pre-low-order bit signal PRE_RES<0:1>. At this time, the access information signal RESULT<0:7> may have a value of '00000001'.

The low-order bit storage block 310 may store the low-order bit signal RESULT<0:1> contained in the access information signal RESULT<0:7> into a position corresponding to the first word line group WLG0. For example, the low-order bit storage block 310 may store '01' in the position corresponding to the first word line group WLG0. The high-order bit storage block 320 may not store the high-order bit signal RESULT<2:7> contained in the access information signal RESULT<0:7> according to the disabled indication signal BOF. This is because the first pre-high-order bit signal PRE_RES<2:7> and the high-order bit signal RESULT<2:7> are equal to each other.

Next, the case in which the word line address signal WL_ADD belonging to the second word line group WLG1 is generated according to the address signal ADD inputted for the sixth time will be described. This case may correspond to the case in which the word line address signal WL_ADD belonging to the second word line group WLG1 is generated for the fourth time.

The word line grouping circuit 200 may generate the word line group address signal WLG_ADD corresponding to the second word line group WLG1 based on the word line address signal WL_ADD belonging to the second word line group WLG1. The access detection circuit 300 may generate the access information signal RESULT<0:7> of '00000100' by adding '1' to the LSB of the pre-access information signal PRE_RES<0:7> corresponding to the second word line group WLG1, based on the word line group address signal WLG_ADD corresponding to the second word line group WLG1. At this time, the pre-access information signal PRE_RES<0:7> corresponding to the second word line group WLG1 may correspond to the access information signal RESULT<0:7> of '00000011' when the word line address signal WL_ADD belonging to the second word line group WLG1 is generated for the third time. The operation of the access detection circuit 300 will be described as follows.

The low-order bit storage block 310 may output the pre-low-order bit signal PRE_RES<0:1> corresponding to the second word line group WLG1 to the access information generation block 330, based on the word line group address signal WLG_ADD. For example, the low-order bit storage block 310 may output the pre-low-order bit signal PRE_RES<0:1> of '11' to the access information generation block 330. Then, the low-order bit storage block 310 may output the indication signal BOF to the high-order bit control block 340, based on the pre-low-order bit signal PRE_RES<0:1> corresponding to the second word line group WLG1. For example, since the pre-low-order bit signal PRE_RES<0:1> has reached '11', the low-order bit storage block 310 may output the enabled indication signal BOF to the high-order bit control block 340.

The high-order bit control block 340 may generate the reallocation confirmation signal BCACHED and the allocation control signal VIC_CTRL, based on the indication signal BOF and the word line group address signal WLG_ADD. For example, since the word line group address signal WLG_ADD corresponding to the second word line group WLG1 is present in the address storage table ADD_TABLE, the high-order bit control block 340 may disable the reallocation confirmation signal BCACHED. Then, the high-order bit control block 340 may generate the allocation control signal VIC_CTRL corresponding to the second position of the address storage table ADD_TABLE, based on the disabled reallocation confirmation signal BCACHED. This is because the word line group address signal WLG_ADD corresponding to the second word line group WLG1 is stored in the second position of the address storage table ADD_TABLE. At this time, the allocation control signal VIC_CTRL may have a value of '01' corresponding to the second position.

The high-order bit storage block 320 may output the first pre-high-order bit signal PRE_RES<2:7> corresponding to the second word line group WLG1 to the access information generation block 330 based on the allocation control signal VIC_CTRL. For example, the high-order bit storage block 320 may output the first pre-high-order bit signal PRE_RES<2:7> of '000000' to the access information generation block 330.

The access information generation block 330 may generate the access information signal RESULT<0:7> corresponding to the first pre-high-order bit signal PRE_RES<2:7> and the pre-low-order bit signal PRE_RES<0:1>, based on the reallocation confirmation signal BCACHED. For example, the selection unit 331 may select the first pre-high-order bit signal PRE_RES<2:7> as the second pre-high-order bit signal PRE_RES'<2:7> according to the disabled reallocation confirmation signal BCACHED, and the output unit 333 may generate the access information signal RESULT<0:7> by adding '1' to the LSB of the pre-access information signal containing the second pre-high-order bit signal PRE_RES'<2:7> and the pre-low-order bit signal PRE_RES<0:1>. At this time, the access information signal RESULT<0:7> may have a value of '00000100'.

The low-order bit storage block 310 may store the low-order bit signal RESULT<0:1> contained in the access information signal RESULT<0:7> into a position corresponding to the second word line group WLG1. For example, the low-order bit storage block 310 may store the low-order bit signal RESULT<0:1> of '00' in the position corresponding to the second word line group WLG1. The high-order bit storage block 320 may store the high-order bit signal RESULT<2:7> contained in the access information signal RESULT<0:7> into the position corresponding to the second word line group WLG1, according to the enabled indication signal BOF. For example, the high-order bit storage block 320 may store the high-order bit signal RESULT<2:7> of '000001' in the position corresponding to the second word line group WLG1.

Figure 9:
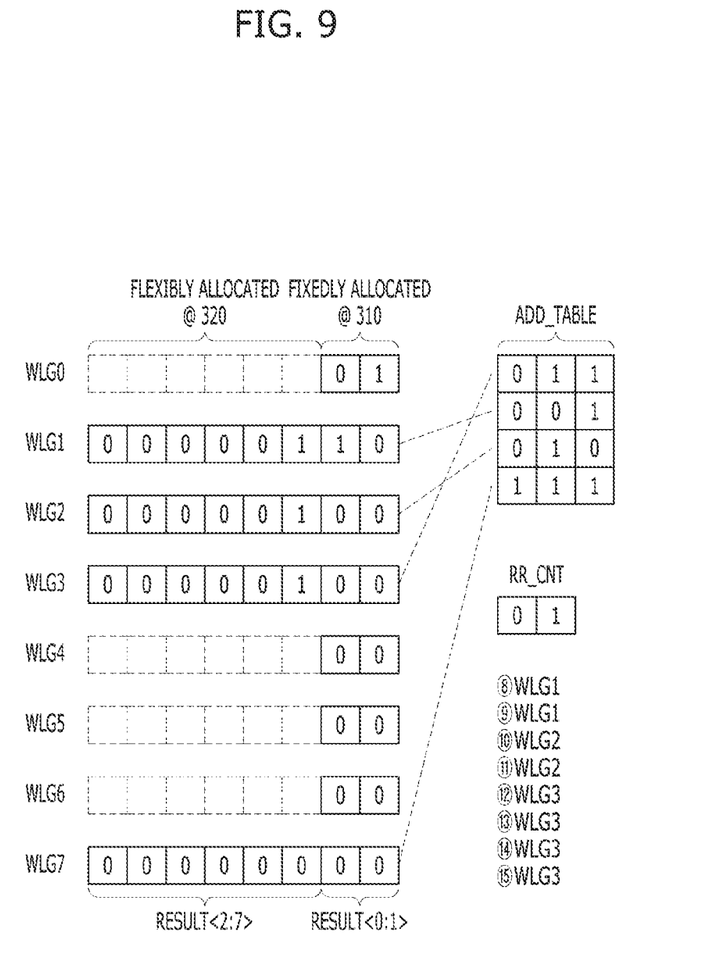

FIG. 9 is a diagram for describing the operation of the semiconductor device, based on the configuration illustrated in FIG. 8.

FIG. 9 may be based on the supposition that eight address signals ADD have been sequentially inputted, the word line address signal WL_ADD belonging to the second word line group WLG1, the word line address signal WL_ADD belonging to the second word line group WLG1, the word line address signal WL_ADD belonging to the third word line group WLG2, the word line address signal WL_ADD belonging to the third word line group WLG2, the word line address signal WL_ADD belonging to the fourth word line group WLG3, the word line address signal WL_ADD belonging to the fourth word line group WLG3, the word line address signal WL_ADD belonging to the fourth word line group WLG3, and the word line address signal WL_ADD belonging to the fourth word line group WLG3 have been sequentially generated as decoding results of the address decoding circuit 100.

In this case, the second word line group WLG1 has been accessed twice, the third word line group WLG2 has been accessed twice, and the fourth word line group WLG3 has been accessed four times. Thus, the access information signal RESULT<0:7> corresponding to the second word line group WLG1 may have a value of '00000110', the access information signal RESULT<0:7> corresponding to the third word line group WLG2 may have a value of '00000100', and the access information signal RESULT<0:7> corresponding to the fourth word line group WLG3 may have a value of '00000100'.

Hereafter, the case in which the word line address signal WL_ADD belonging to the fourth word line group WLG3 is generated according to the address signal ADD inputted for the 15th time will be representatively described. This case may correspond to the case in which the word line address signal WL_ADD belonging to the fourth word line group WLG3 is generated for the fourth time.

The word line grouping circuit 200 may generate the word line group address signal WLG_ADD corresponding to the fourth word line group WLG3 based on the word line address signal WL_ADD belonging to the fourth word line group WLG3. The access detection circuit 300 may generate the access information signal RESULT<0:7> of '00000100' by adding '1' to the LSB of the pre-access information signal PRE_RES<0:7> corresponding to the fourth word line group WLG3, based on the word line group address signal WLG_ADD corresponding to the fourth word line group WLG3. At this time, the pre-access information signal PRE_RES<0:7> corresponding to the fourth word line group WLG3 may correspond to the access information signal RESULT<0:7> of '00000011' when the word line address signal WL_ADD belonging to the fourth word line group WLG3 is generated for the third time. The operation of the access detection circuit 300 will be described as follows.

The low-order bit storage block 310 may output the pre-low-order bit signal PRE_RES<0:1> corresponding to the fourth word line group WLG3 to the access information generation block 330, based on the word line group address signal WLG_ADD. For example, the low-order bit storage block 310 may output the pre-low-order bit signal PRE_RES<0:1> of '11' to the access information generation block 330. Furthermore, the low-order bit storage block 310 may output the indication signal BOF to the high-order bit control block 340, based on the pre-low-order bit signal PRE_RES<0:1> corresponding to the fourth word line group WLG3. For example, since the pre-low-order bit signal PRE_RES<0:1> has reached '11', the low-order bit storage block 310 may output the enabled indication signal BOF to the high-order bit control block 340.

The high-order bit control block 340 may generate the reallocation confirmation signal BCACHED and the allocation control signal VIC_CTRL, based on the indication signal BOF and the word line group address signal WLG_ADD. For example, since the word line group address signal WLG_ADD corresponding to the fourth word line group WLG3 is not present in the address storage table ADD_TABLE, the high-order bit control block 340 may enable the reallocation confirmation signal BCACHED. At this time, the high-order bit control block 340 may store the word line group address signal WLG_ADD corresponding to the fourth word line group WLG3 into the first position of the address storage table ADD_TABLE according to the first position information signal RR_CNT of '00'. Furthermore, the high-order bit control block 340 may generate the allocation control signal VIC_CTRL using the first position information signal RR_CNT stored in the register 343_5, based on the enabled reallocation confirmation signal BCACHED. At this time, the allocation control signal VIC_CTRL may have a value of '00' corresponding to the first position. Then, the high-order bit control block 340 may add '1' to the LSB of the first position information signal RR_CNT, and store the first position information signal RR_CNT of '01' in the register 343_5.

The high-order bit storage block 320 may output the first pre-high-order bit signal PRE_RES<2:7> corresponding to the fourth word line group WLG3 to the access information generation block 330, based on the allocation control signal VIC_CTRL. For example, the high-order bit storage block 320 may output the first pre-high-order bit signal PRE_RES<2:7> of '000000' to the access information generation block 330.

The access information generation block 330 may generate the access information signal RESULT<0:7> corresponding to the pre-high-order bit signal PRE_RES<2:7> and the pre-low-order bit signal PRE_RES<0:1>, based on the reallocation confirmation signal BCACHED. For example, the selection unit 331 may select the pre-high-order bit signal PRE_RES<2:7> as the second pre-high-order bit signal PRE_RES'<2:7> according to the enabled reallocation confirmation signal BCACHED, and the output unit 333 may generate the access information signal RESULT<0:7> by adding '1' to the LSB of the pre-access information signal containing the second pre-high-order bit signal PRE_RES'<2:7> and the pre-low-order bit signal PRE_RES<0:1>. At this time, the access information signal RESULT<0:7> may have a value of '00000100'.

The low-order bit storage block 310 may store the low-order bit signal RESULT<0:1> contained in the access information signal RESULT<0:7> into a position corresponding to the fourth word line group WLG3. For example, the low-order bit storage block 310 may store '00' in the position corresponding to the fourth word line group WLG3. The high-order bit storage block 320 may store the high-order bit signal RESULT<2:7> contained in the access information signal RESULT<0:7> into the position corresponding to the fourth word line group WLG3, according to the enabled indication signal BOF. For example, the high-order bit storage block 320 may store the high-order bit signal RESULT<2:7> of '000001' in the position corresponding to the fourth word line group WLG3.

In accordance with the present embodiments, when the plurality of access information signals indicating the numbers of accesses to the plurality of word line groups are stored, high-order bits contained in a part of the plurality of access information signals can be flexibly stored in a storage block having a limited capacity.

The semiconductor device can minimize the capacity of the storage block used for detecting row hammering, thereby minimizing the area and fabrication cost of the semiconductor device.

The semiconductor apparatuses and or methods as discussed above (see FIGS. 1-9) are particular useful in the design of other memory devices, processors, and computer systems. For example, referring to FIG. 10, a block diagram of a system employing a semiconductor apparatus and or method in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 10:
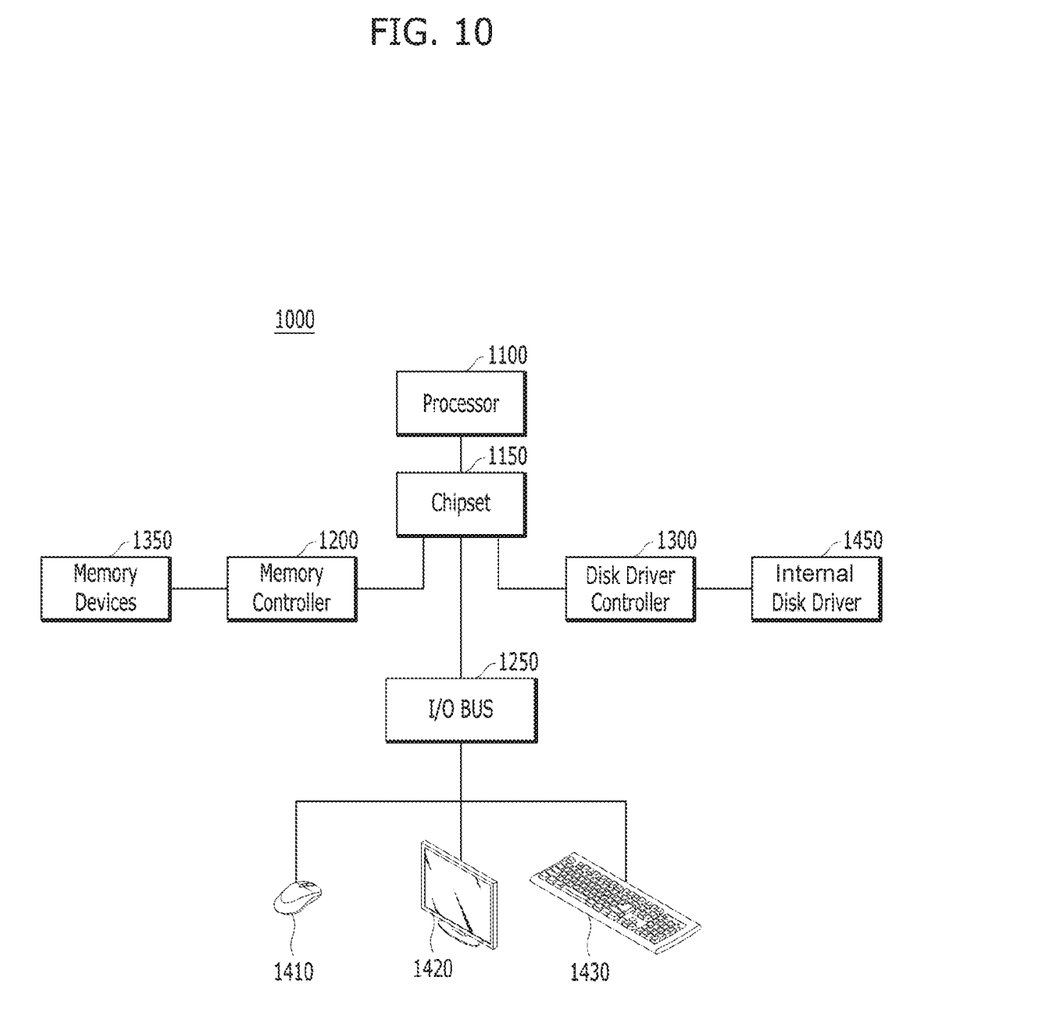
FIG. 10 illustrates a block diagram of an example of a representation of a system employing a semiconductor apparatus and or method of driving the same with the various embodiments discussed above with relation to FIGS. 1-9.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus and or method as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus and or method as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 10 is merely one example of a semiconductor apparatus and or method as discussed above with relation to FIGS. 1-9. In alternate embodiments, such as, for example but not limited to, cellular phones or digital cameras, the components may differ from the embodiments illustrated in FIG. 10.

Although various embodiments have been described for illustrative purposes, it will be apparent to those skilled in the art that various changes and modifications may be made without departing from the spirit and scope of the disclosure as defined in the following claims.

What is claimed is:

1. A semiconductor device comprising:
   a low-order bit storage block configured for storing N low-order bit signals contained in N access information signals based on an address signal, the N access information signals indicating the numbers of accesses to N access target blocks, and generating an indication signal indicating whether a low-order bit signal corresponding to a current input address signal among the N low-order bit signals has reached a predetermined value, where N is a natural number equal to or greater than 2;
   a high-order bit storage block configured for storing M high-order bit signals contained in M access information signals among the N access information signals based on an allocation control signal, where M is a natural number less than N; and
   a high-order bit control block configured for generating the allocation control signal corresponding to positions in which the M high-order bit signals are to be stored, based on the address signal and the indication signal.

2. The semiconductor device of claim 1, wherein the low-order bit storage block has a capacity corresponding to the N low-order bit signals, and
   the high-order bit storage block has a capacity corresponding to the M high-order bit signals.

3. The semiconductor device of claim 1, wherein the high-order bit storage block is configured to allocate the positions in which the M high-order bit signals are to be stored, through a predefined method based on the allocation control signal.

4. The semiconductor device of claim 3, wherein the high-order bit control block comprises:
   a logical operation unit configured for generating an update signal by performing a logical operation on the indication signal and a reallocation confirmation signal;
   a first position information signal generation unit configured for generating a first position information signal which is varied through the predefined method, based on the update signal;
   a second position information signal generation unit configured for generating the reallocation confirmation signal indicating whether to reallocate a position in which any one of the M high-order bit signals is to be stored, and generating a second position information signal indicating positions in which the M high-order bit signals are to be stored, based on the first position information signal, the update signal and the address signal; and
   an allocation control signal output unit configured for outputting any one of the first and second position information signals as the allocation control signal based on the reallocation confirmation signal.

5. The semiconductor device of claim 4, wherein the first position information signal generation unit comprises:
   an adder configured for generating a first position information variation signal by up-counting the first position information signal according to the predefined method;
   a multiplexer configured for outputting any one of the first position information signal and the first position information variation signal as a first position information output signal based on the update signal; and
   a register configured for storing the first position information output signal as the first position information signal.

6. The semiconductor device of claim 3, wherein the predefined method comprises a round robin method.

7. The semiconductor device of claim 4, wherein the second position information signal generation unit comprises an address storage table for storing M address signals corresponding to the M access information signals, and generates the reallocation confirmation signal depending on whether the current input address signal coincides with any one of the M address signals.

8. The semiconductor device of claim 4, further comprising an access information generation block configured for generating an access information signal corresponding to the current input address signal among the N access information signals, based on the reallocation confirmation signal.

9. The semiconductor device of claim 4, wherein the access information generation block comprises:
   a selection unit configured for selecting any one of a preset high-order bit signal and a first pre-high-order bit signal as a second pre-high-order bit signal, based on the reallocation confirmation signal, the first pre-high-order bit signal including any one corresponding to the current input address signal among the M high-order bit signals stored in the high-order bit storage block; and an output unit configured for up-counting a pre-access information signal containing the second pre-high-order bit signal and a pre-low-order bit signal, and outputting the access information signal, the pre-low-order bit signal including any one corresponding to the current input address signal among the N low-order bit signals stored in the low-order bit storage block.

10. A semiconductor device comprising:
   a memory cell array;
   an access detection circuit configured for storing N low-order bit signals contained in N access information signals indicating the numbers of accesses to N word line groups and M high-order bit signals contained in M access information signals among the N access information signals, based on a word line group address signal, and generating an access information signal corresponding to a current input word line group address signal among the N access information signals, where M is a natural number less than N; and
   a refresh control circuit configured for generating a target group address signal required for a refresh operation of the memory cell array, based on the word line group address signal, the access information signal, and a refresh control signal.

11. The semiconductor device of claim 10, wherein the access detection circuit comprises:
   a low-order bit storage block configured for storing the N low-order bit signals based on an address signal, and generating an indication signal indicating whether a low-order bit signal corresponding to the current input word line group address signal among the N low-order bit signals has reached a predetermined value;
   a high-order bit storage block configured for storing the M high-order bit signals based on an allocation control signal; and
   a high-order bit control block configured for generating the allocation control signal corresponding to positions in which the M high-order bit signals are to be stored, based on the word line group address signal and the indication signal.

12. The semiconductor device of claim 11, wherein the low-order bit storage block has a capacity corresponding to the N low-order bit signals, and
   the high-order bit storage block has a capacity corresponding to the M high-order bit signals.

13. The semiconductor device of claim 11, wherein the high-order bit storage block is configured to allocate the positions in which the M high-order bit signals are to be stored, through a predefined method based on the allocation control signal.

14. The semiconductor device of claim 13, wherein the high-order bit control block comprises:
   a logical operation unit configured for generating an update signal by performing a logical operation on the indication signal and a reallocation confirmation signal;
   a first position information signal generation unit configured for generating a first position information signal which is varied through the predefined method, based on the update signal;
   a second position information signal generation unit configured for generating the reallocation confirmation signal indicating whether to reallocate a position in which any one of the M high-order bit signals is to be stored, and generating a second position information signal indicating the positions in which the M high-order bit signals are to be stored, based on the first position information signal, the update signal and the word line group address signal; and
   an allocation control signal output unit configured for outputting any one of the first and second position information signals as the allocation control signal based on the reallocation confirmation signal.

15. The semiconductor device of claim 14, wherein the first position information signal generation unit comprises:
   an adder configured for generating a first position information variation signal by up-counting the first position information signal according to the predefined method;
   a multiplexer configured for selecting any one of the first position information signal and the first position information variation signal as a first position information output signal based on the update signal; and
   a register configured for storing the first position information output signal as the first position information signal.

16. The semiconductor device of claim 13, wherein the predefined method comprises a round robin method.

17. The semiconductor device of claim 14, wherein the second position information signal generation unit comprises an address storage table for storing M word line group address signals corresponding to the M access information signals, and generates the reallocation confirmation signal depending on whether a current input address signal coincides with any one of the M word line group address signals.

18. The semiconductor device of claim 14, wherein the access detection circuit comprises an access information generation block configured for generating an access information signal corresponding to the current input word line group address signal among the N access information signals, based on the reallocation confirmation signal.

19. The semiconductor device of claim 18, wherein the access information generation block comprises:
   a selection unit configured for selecting any one of a preset high-order bit signal and a first pre-high-order bit signal as a second pre-high-order bit signal based on the reallocation confirmation signal, the first pre-high-order bit signal including any one corresponding to a current input address signal among the M high-order bit signals stored in the high-order bit storage block; and
   an output unit configured for up-counting a pre-access information signal containing the second pre-high-order bit signal and a pre-low-order bit signal and outputting the access information signal, the pre-low-order bit signal including any one corresponding to the current input address signal among the N low-order bit signals stored in the low-order bit storage block.

20. The semiconductor device of claim 10, further comprising:
   an address decoding circuit configured for generating an access address signal corresponding to a selected word line among a plurality of word lines included in the N word line groups, based on an address signal;
   an address grouping circuit configured for generating the word line group address signal corresponding to a word line group including the selected word line among the N word line groups, based on the access address signal; and
   a word line driving circuit configured for driving one or more word lines among the plurality of word lines, based on the access address signal and the target group address signal.

21. A method of driving a semiconductor device, comprising:

receiving a word line group address signal;

storing N low-order bit signals contained in N access information signals into a low-order bit storage block in fixedly allocated positions based on the word line group address signal, the N access information signals indicating the numbers of accesses to N word line groups, where N is a natural number equal to or greater than 2;

storing M high-order bit signals contained in M access information signals among the N access information signals into a high-order bit storage block in flexibly allocated portion based on the word line group address signal, where M is a natural number smaller than N; and driving a selected word line group among the N word line groups based on the word line group address signal, the N access information signals and a refresh control signal.

22. The method of claim 21, wherein the storing of the M high-order bit signals comprises selecting the M access information signals in descending order of the access number, among the N access information signals, whenever the word line group address signal is inputted.

23. The method of claim 21, wherein the storing of the M high-order bit signals comprises:

determining whether there is a low-order bit signal having reached a predetermined value among the N low-order bit signals, whenever the word line group address signal is inputted;

allocating or reallocating positions where the M high-order bit signals are to be stored in the high-order storage block, through a predefined method according to the determination result; and storing the M high-order bit signals in the allocated or reallocated positions.

* * * * *